United States Patent
Kusaka et al.

(10) Patent No.: US 9,945,905 B2
(45) Date of Patent: Apr. 17, 2018

(54) TEST APPARATUS DETERMINING THRESHOLD SIGNAL USING HISTORY OF JUDGMENT VALUE

(71) Applicant: ADVANTEST CORPORATION, Nerima-ku, Tokyo (JP)

(72) Inventors: Takashi Kusaka, Tokyo (JP); Masahiro Ishida, Tokyo (JP)

(73) Assignee: ADVANTEST CORPORATION, Nerima-ku, Tokyo (JP)

( * ) Notice: Subject to any disclaimer, the term of this patent is extended or adjusted under 35 U.S.C. 154(b) by 308 days.

(21) Appl. No.: 14/825,425

(22) Filed: Aug. 13, 2015

(65) Prior Publication Data

US 2017/0045564 A1 Feb. 16, 2017

(51) Int. Cl.

| G01R 27/28 | (2006.01) |
| G01R 31/02 | (2006.01) |
| G01R 31/317 | (2006.01) |
| G11C 29/02 | (2006.01) |
| G11C 29/56 | (2006.01) |

(52) U.S. Cl.
CPC ........ *G01R 31/3171* (2013.01); *G11C 29/028* (2013.01); *G11C 29/56008* (2013.01); *G11C 29/56012* (2013.01)

(58) Field of Classification Search
None
See application file for complete search history.

(56) References Cited

U.S. PATENT DOCUMENTS

| 8,896,332 B2 * | 11/2014 | Ishida | G01R 31/31924 324/73.1 |
| 2010/0097103 A1 * | 4/2010 | Tokoro | H03K 5/088 327/72 |
| 2012/0323519 A1 * | 12/2012 | Ishida | G01R 31/31932 702/125 |

FOREIGN PATENT DOCUMENTS

| JP | 60-254279 A | 12/1985 |
| JP | 2001-156596 A | 6/2001 |
| JP | 2010-103663 A | 5/2010 |
| JP | 2011-215127 A | 10/2011 |

* cited by examiner

*Primary Examiner* — Justin R Knapp
(74) *Attorney, Agent, or Firm* — Cantor Colburn LLP (57) ABSTRACT

A reception circuit receives, via a cable, a transmission signal $S_{TX}$ generated by a DUT. A comparator circuit compares a reception signal $S_{RX}$ after signal transmission with at least one threshold signal $V_{TH}$, and generates a judgment value $D_{OUT}$ that represents a comparison result for every sampling timing. A threshold generation circuit generates at least one threshold signal $V_{TH}$. A threshold control circuit adjusts each level of at least one threshold signal $V_{TH}$ at a given sampling timing based on the history of the judgment value $D_{OUT}$ acquired at a past sampling timing.

7 Claims, 8 Drawing Sheets

FIG.1

"Prior Art"

TEST APPARATUS DETERMINING THRESHOLD SIGNAL USING HISTORY OF JUDGMENT VALUE

BACKGROUND OF THE INVENTION

Field of the Invention

The present invention relates to a test apparatus.

Description of the Related Art

Figure 1:
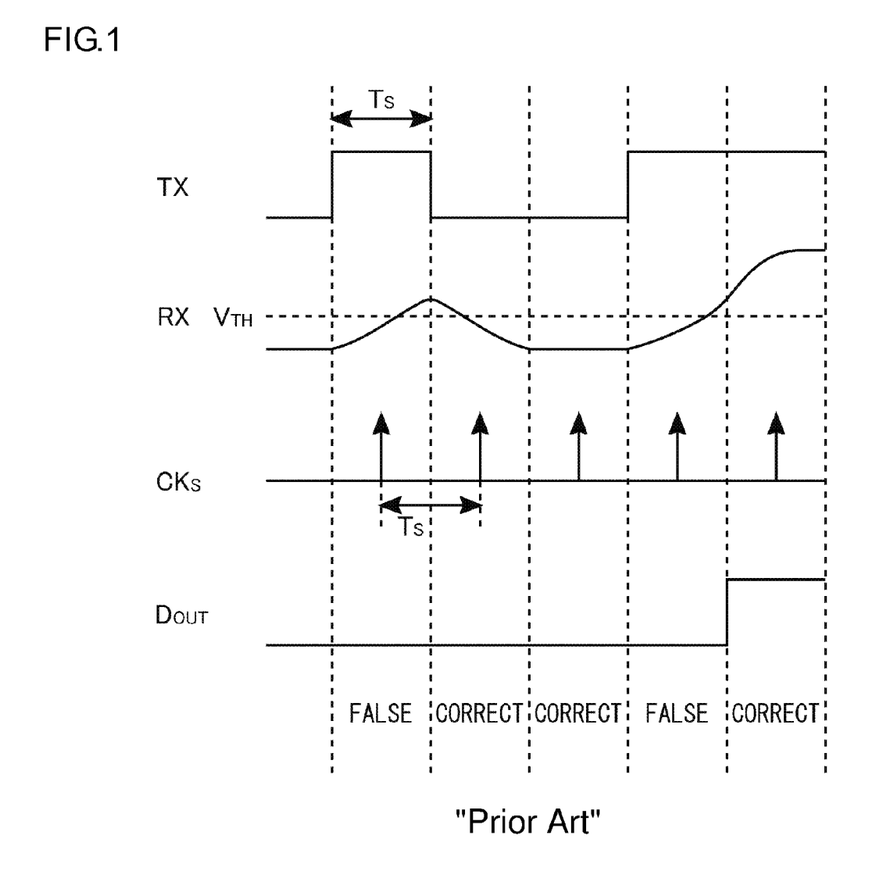
FIG. 1 is a diagram showing an effect of power loss that occurs in a transmission path.

With a high-speed digital signal transmission system that transmits a high-speed digital signal across a given long distance, marked transmission loss occurs in a transmission path. This leads to degradation in the high-frequency characteristics, resulting in degradation in waveform quality. FIG. 1 is a diagram for describing the effects of the loss that occurs in the transmission path. Description will be made regarding an arrangement in which the signal to be transmitted is configured as a binary digital signal that is switchable between high level and low level. Such a system requires a long signal transition time at a reception end (RX) as compared with signal transition at a transmission end (TX) when the digital signal transits from high level to low level or otherwise from low level to high level. This leads to waveform dulling at the reception end (RX). The signal received at the reception end (RX) is compared with a predetermined threshold value $V_{TH}$ at a timing of a sampling clock $CK_S$ so as to judge whether the signal level is high level or low level.

An increase in the transmission distance leads to marked waveform dulling. In this case, the transmission of the received signal does not complete at the reception end RX within the sampling timing, leading to false detection of high level or low level. With a transmission path that involves large transmission loss, in some cases, the transmission time becomes longer than each sampling interval $T_S$.

Known examples of an approach proposed in order to solve the aforementioned problem include a pre-emphasis technique. Specifically, a pre-emphasis circuit is provided to the transmission end so as to boost the high-frequency component of a transmission signal according to the attenuation characteristics of the transmission path (high-frequency emphasis). Furthermore, an equalizer is provided to the reception end so as to compensate for degradation in the high-frequency characteristics of the transmission path.

However, such a method requires the transmission end and the reception end to have a high driving capability and a high operation speed that are sufficient for the signal characteristics required for the transmission signal. On the other hand, the driving capability and the operation speed are limited by the semiconductor process. Thus, in a case in which such a transmission system requires a large amount of compensation, in some cases, such a method cannot be employed.

Patent documents listed below discloses the related arts.
Patent Document 1
  Japanese Patent Application Laid Open No. 2001-156596/
Patent Document 2
  Japanese Patent Application Laid Open No. 2011-215127
Patent Document 3
  Japanese Patent Application Laid Open No. 2010-103663
Patent Document 4
  Japanese Patent Application Laid Open No. S60-254279

SUMMARY OF THE INVENTION

The present invention has been made in order to solve the aforementioned problem. Accordingly, it is an exemplary purpose of the present invention to provide a test apparatus which is capable of transmitting a signal using an approach that differs from pre-emphasis.

An embodiment of the present invention relates to a test apparatus that receives, via a transmission path, a transmission signal generated by a device under test. The test apparatus comprises: a comparator circuit that compares a reception signal after signal transmission with at least one threshold signal, and generates a judgment value that represents a comparison result for every sampling timing; a threshold generation circuit that generates the at least one threshold signal; and a threshold control circuit that adjusts a level of each of the at least one threshold signal at a given sampling timing based on a history of the judgment value obtained at a past sampling timing.

When it can be assumed that the signal has been received correctly at previous timings, it can also be assumed that the history of the judgment values acquired at previous sampling timings represents the waveform of the transmission signal. In this case, in a case in which the transmission path characteristics are known, the waveform of the reception signal can be predicted based on the assumed transmission signal. With such an embodiment, by dynamically adjusting the level of the threshold signal based on the predicted waveform of the reception signal, such an arrangement is capable of receiving a signal correctly.

Also, the transmission signal may be configured as a binary signal that can switch between a high level and a low level. Also, the at least one threshold signal may include a single threshold signal. Also, the threshold generation circuit may be capable of switching the single threshold signal between a lower level and an upper level that is higher than the lower level according to a control operation by the threshold control circuit. Also, when the judgment value obtained at an immediately previous sampling timing represents a low level, the threshold control circuit may set the threshold signal to the lower level. Also, when the judgment value obtained at an immediately previous sampling timing represents a high level, the threshold control circuit may set the threshold signal to the upper level.

Also, the transmission signal may be configured as a binary signal that can switch between a high level and a low level. Also, the aforementioned at least one threshold signal may include a single threshold signal. Also, the threshold generation circuit may be capable of switching the single threshold signal between multiple levels according to a control operation by the threshold control circuit. Also, the threshold control circuit may set the threshold signal to one among the multiple levels according to a combination of the judgment values acquired at N (N represents an integer) immediately previous timings.

Also, the threshold generation circuit may be capable of switching the single threshold signal between $2^N$ levels.

The test apparatus according to an embodiment may further comprise an optimization circuit that optimizes multiple levels that can be set for at least one threshold signal in a state in which a training pattern is supplied to the test apparatus via the transmission path instead of the transmission signal generated by the device under test.

Also, the optimization circuit may optimize the multiple levels that can be set for the at least one threshold signal such that a bit error rate becomes small.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

Figure 2:
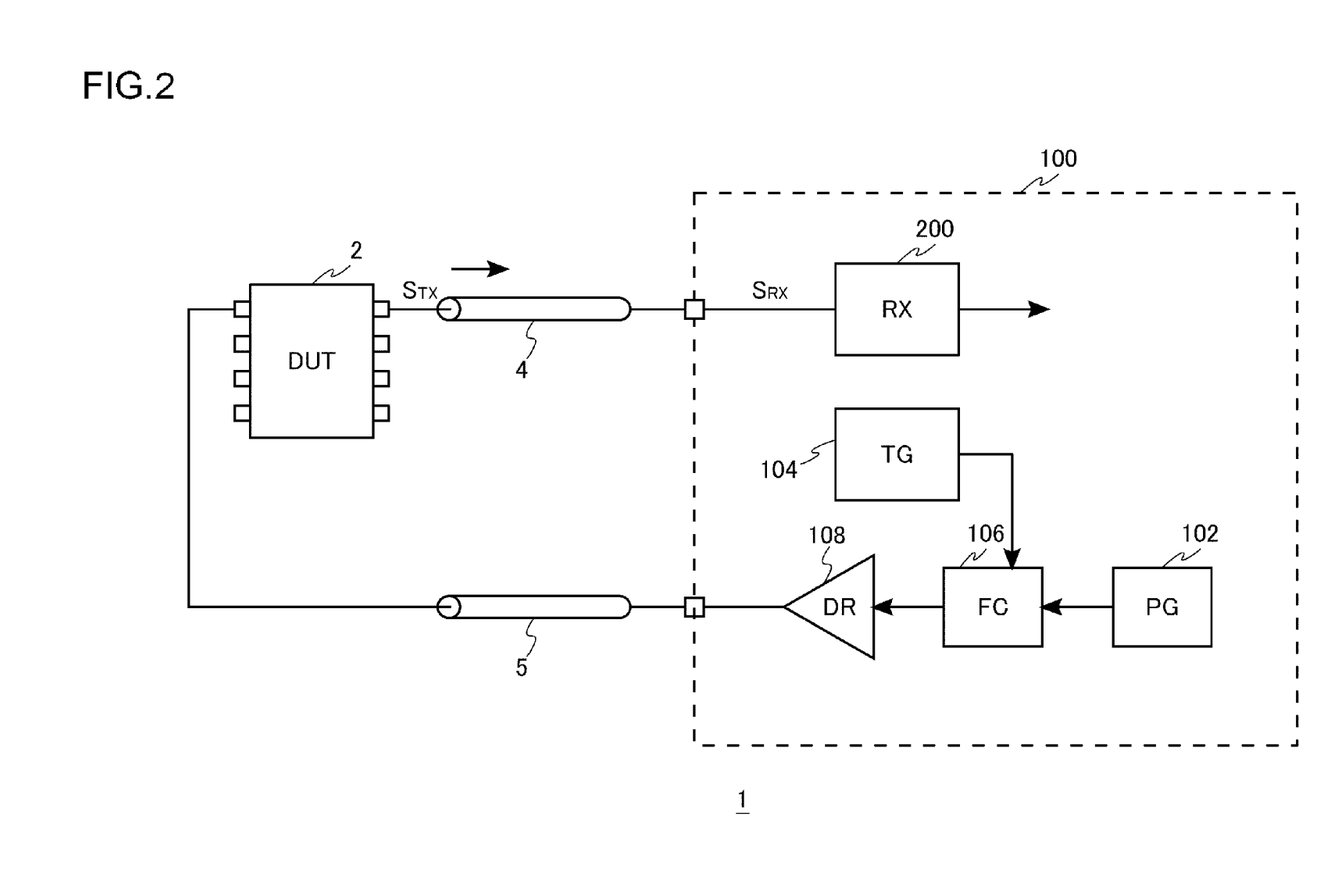
FIG. 2 is a block diagram showing a test system.

FIG. 2 is a block diagram showing a test system 1. The test system 1 includes a DUT (device under test) 2, a cable (transmission path) 4, and a test apparatus 100. The test apparatus 100 is connected to the DUT 2 via the cables 4 and 5. For ease of understanding and simplification of description, FIG. 2 shows a configuration of a single channel PE (Pin Electronics) alone. However, in practice, the test apparatus 100 is configured to have several tens of to several thousand of channels.

Examples of the DUT 2 include DRAM (Dynamic Random Access Memory), SRAM (Static Random Access Memory), flash memory, CPU (Central Processing Unit), GPU (Graphics Processing Unit), FPGA (Field Programmable Gate Array), ASIC (Application Specific Integrated Circuit), and the like. In the present embodiment, the DUT 2 is configured as memory such as DRAM or the like.

The test apparatus 100 includes a pattern generator 102, a timing generator 104, a format controller 106, a driver 108, and a reception circuit 200. The pattern generator 102 generates a test pattern to be supplied to the DUT 2. The timing generator 104 is configured as a unit that controls the operation timing of the test apparatus 100, and generates various kinds of timing signals. Examples of such a timing signal include a signal that indicates an edge timing of a test signal to be supplied to the DUT 2, a signal that indicates a timing at which the reception circuit 200 judges the level of the received signal, etc.

The format controller 106 generates a test signal in a predetermined signal format according to the test pattern and the timing signal. The driver 108 receives the test pattern from the format controller 106, and supplies the test pattern thus received to the DUT 2 via the cable 5. It should be noted that the test apparatus 100 may be configured to have other architectures according to known or prospectively available techniques, in addition to the configuration shown in FIG. 2.

The DUT 2 receives a test pattern from the test apparatus 100. Subsequently, the DUT 2 generates a transmission signal $S_{TX}$ configured as a serial signal according to the test pattern thus received. For example, in a case in which the DUT 2 is configured as memory, data is written to the DUT 2 in a write sequence, following which the data thus written is read out as a transmission signal $S_{TX}$ in the subsequent read sequence. Also, the transmission signal $S_{TX}$ may be configured as a signal generated by a BIST (Built-In Self Test) circuit built into the DUT 2. Also, the transmission signal $S_{TX}$ may be configured as a notice signal that indicates the completion of data writing, etc.

The test apparatus 100 receives, via the cable 4, the transmission signal $S_{TX}$ generated by the DUT 2. The transmission signal $S_{TX}$ may be configured as a binary digital signal that is switchable to high level (1) or low level (0). Alternatively, the transmission signal $S_{TX}$ may be configured a multi-level digital signal that is switchable among three or more values. Also, the transmission signal $S_{TX}$ may be configured as a single-ended signal. Also, the transmission signal may be configured as a voltage signal or otherwise a current signal. That is to say, the transmission signal $S_{TX}$ may be configured in a desired signal format.

In some cases, the DUT 2 and the test apparatus 100 are arranged such that they are distant from each other. Specifically, in some cases, the cable 4 has a length of several meters to several tens of meters. In a case in which the cable 4 has a long length, such a cable 4 involves transmission loss, leading to degradation in the waveform quality of a signal that propagates through the cable 4. The reception circuit 200 receives a reception signal $S_{RX}$ having a degraded waveform, and generates a binary or otherwise multi-level digital signal that represents the original level. The test apparatus 100 judges the quality of the DUT 2 or identifies a defect portion based on the digital signal received from the reception circuit 200. Alternatively, the test apparatus 200 controls a test sequence based on the digital signal received from the reception circuit 200.

Figure 3:
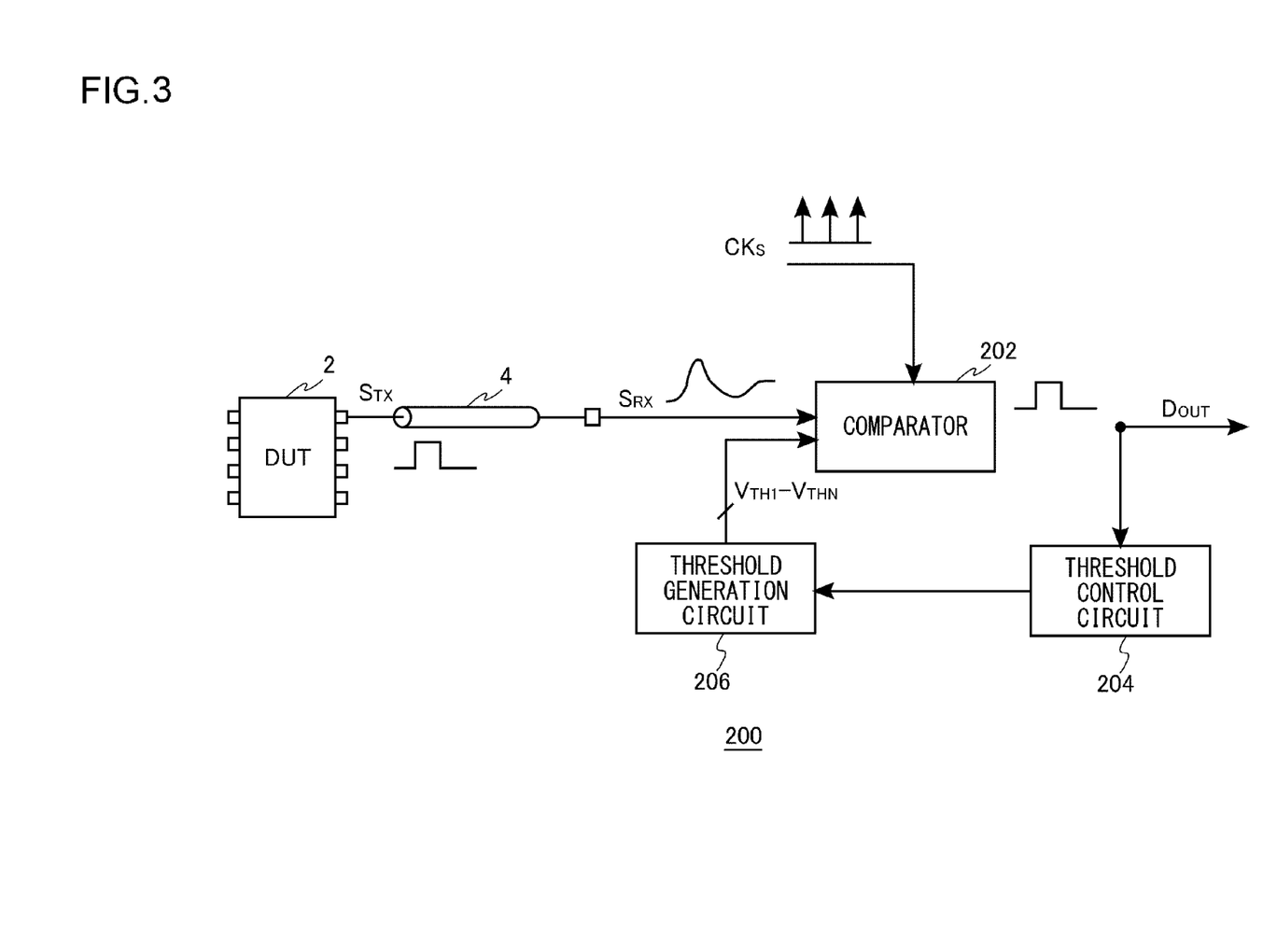
FIG. 3 is a block diagram showing a reception circuit.

Next, description will be made according to an embodiment regarding the configuration of the reception circuit 200 that is suitably applicable to the test apparatus 100 shown in FIG. 2. FIG. 3 is a block diagram showing the reception circuit 200. The reception circuit 200 includes a comparator 202, a threshold control circuit 204, and a threshold generation circuit 206.

The comparator 202 compares the reception signal $S_{RX}$ thus received with at least one from among threshold signals $V_{TH1}$ through $V_{THN}$ (N is an integer of 1 or more) at sampling timings $t_0$, $t_1$, $t_2$, ..., with predetermined time intervals $T_S$, and generates a judgment value $D_{OUT}$ that represents the comparison result. The sampling timings $t_0$, $t_1$, $t_2$, ..., are each defined by an edge of the sampling clock $CK_S$.

The generating method for generating the sampling clock $CK_S$ is not restricted in particular. For example, in a case in which the DUT 2 generates a serial clock in addition to the reception signal $S_{RX}$, the serial clock thus generated may be used as the sampling clock $CK_S$ in the reception circuit 200. Also, the serial clock thus generated may be divided or otherwise multiplied, and the serial clock thus processed may be used as the sampling clock $CK_S$. In a case in which a clock signal is embedded in the transmission signal $S_{TX}$, a CDR circuit may regenerate a clock signal from the transmission signal $S_{TX}$, and the clock signal thus regenerated may be used as the sampling clock $CK_S$. In a case in which the test apparatus 100 is configured as an asynchronous system, the sampling clock $CK_S$ may be generated by means of the timing generator 104 shown in FIG. 2 or an unshown oscillator.

The threshold generation circuit 206 generates at least one or more threshold signals $V_{TH0}$ through $V_{THN}$. Each threshold signal $V_{TH}$ may be selected from among multiple levels. Directing attention to the i-th threshold signal $V_{THi}$, the i-th threshold signal $V_{THi}$ is defined to have its own reference signal level $V_{REFi}$. Furthermore, in the vicinity of the reference signal level $V_{REFi}$, multiple levels $V_{THi\_1}$ through $V_{THi\_M}$ are defined. Here, M represents an integer of 2 or more. The threshold generation circuit 206 may be configured as a D/A converter or a variable voltage source.

The judgment value $D_{OUT}$ from the comparator 202 is input to the threshold control circuit 204. The threshold generation circuit 206 adjusts the level of at least one of the threshold signals $V_{TH1}$ through $V_{THN}$ at a given sampling timing t based on the history of the judgment value $D_{OUT}$ obtained at the previous sampling timings $t_k$ (k<j).

The above is the basic configuration of the reception circuit 200. Next, description will be made regarding several examples of a control operation for controlling the threshold signal $V_{TH}$. For ease of understanding and simplification of description, description will be made regarding an arrangement in which the transmission signal $S_{TX}$ is configured as a binary digital signal that switches between high level (1) and low level (0). The comparator 202 compares the reception signal $S_{RX}$ with a single corresponding threshold voltage $V_{TH}$. When the reception signal $S_{RX}$ is higher than the threshold voltage $V_{TH}$, the comparator 202 outputs the judgment value $D_{OUT}$ having a first level (e.g., high level=1). Conversely, when the reception signal $S_{RX}$ is lower than the threshold voltage $V_{TH}$, the comparator 202 outputs the judgment value $D_{OUT}$ having a second level (e.g., low level=0).

Description will be made regarding an arrangement in which the threshold voltage $V_{TH}$ is switchable between two levels (lower level $V_{TH\_1}$ and upper level $V_{TH\_2}$). For example, in the following description, $V_H$ represents the voltage level of the reception signal $S_{RX}$ in a case in which the transmission signal $S_{TX}$ is maintained at high level for a given long period. $V_L$ represents the voltage level of the reception signal $S_{RX}$ in a case in which the transmission signal $S_{TX}$ is maintained at low level for a given long period. In this case, the reference signal level $V_{REF}$ is preferably set to a midpoint between the two voltage levels $V_H$ and $V_L$. Furthermore, the two levels $V_{TH\_1}$ and $V_{TH\_2}$ that can be set for the threshold voltage $V_{TH}$ are defined in the vicinity of the reference voltage level $V_{REF}$. The threshold generation circuit 206 is configured to switch the threshold signal $V_{TH}$ between the lower level $V_{TH\_1}$ and the upper level $V_{TH\_2}$ according to the control operation of the threshold control circuit 204.

When the judgment value $D_{OUT}$ is set to low level at the immediately previous sampling timing $t_k = t_{j-1}$, the threshold control circuit 204 sets the threshold signal $V_{TH}$ to the lower level $V_{TH\_1}$ at a given sampling timing $t_j$. Conversely, when the judgment value $D_{OUT}$ is set to high level at the immediately previous sampling timing, the threshold control circuit 204 sets the threshold signal $V_{TH}$ to the upper level $V_{TH\_2}$ at a given sampling timing.

Figure 4A:
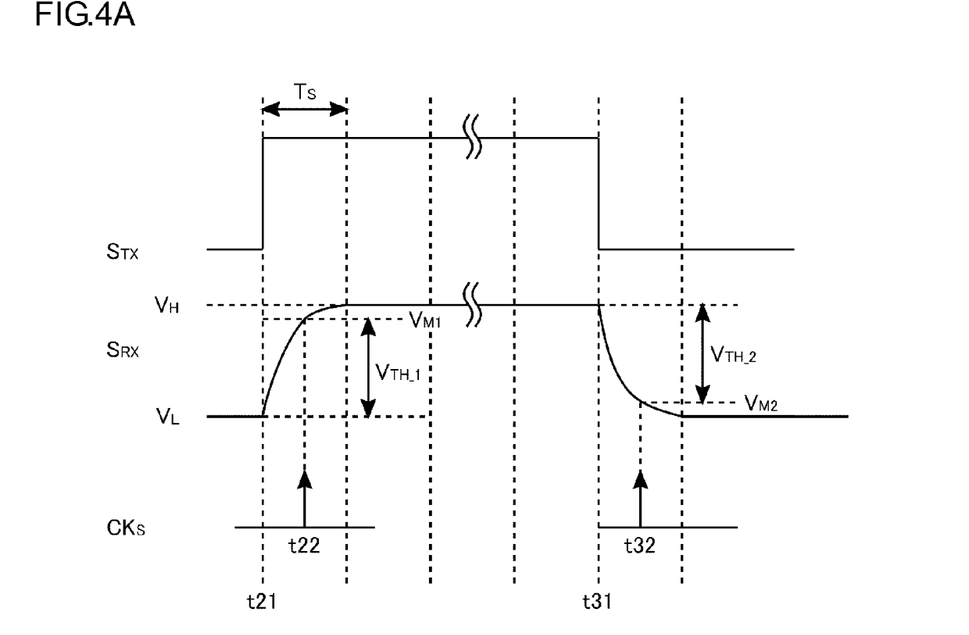
FIGS. 4A and 4B are diagrams for describing a lower level $V_{TH\_1}$ and an upper level $V_{TH\_2}$.
Figure 4B:
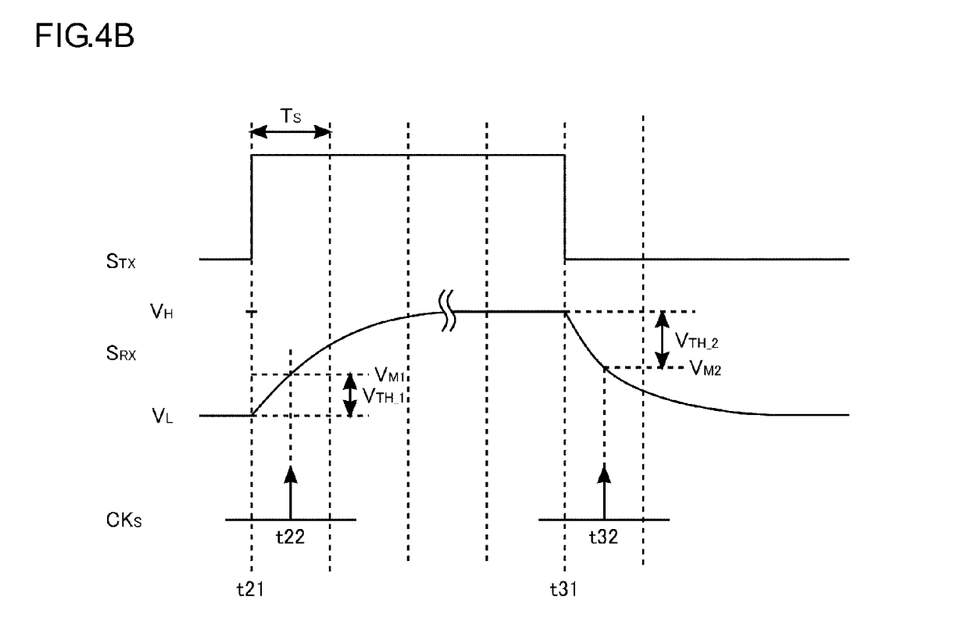

FIGS. 4A and 4B are diagrams for describing the lower level $V_{TH\_1}$ and the upper level $V_{TH\_2}$. The waveform of the reception signal $S_{RX}$ observed at the reception end is determined based on the waveform of the transmission signal $S_{TX}$ and the frequency characteristics of the transmission line. FIG. 4A shows a case in which the transmission line has small transmission loss, and FIG. 4B shows a case in which the transmission line has large transmission loss.

When the transmission signal $S_{TX}$ transits from low level in the initial state to high level at the time point $t_{21}$, the reception signal $S_{RX}$ changes from the low level voltage $V_L$ toward the high level voltage $V_H$. In this case, the slope and the waveform of the reception signal $S_{RX}$ depend on the frequency characteristics of the transmission path. With the voltage level of the reception signal $S_{RX}$ at the subsequent sampling timing $t_{22}$ as $V_{M1}$, the lower level $V_{TH\_1}$ is defined such that the relation $V_L < V_{TH\_1} < V_{M1}$ holds true.

When the transmission signal $S_{TX}$ transits from high level to low level at the time point $t_{31}$, the reception signal $S_{RX}$ changes from the high level voltage $V_H$ toward the low level voltage $V_L$. In this case, the slope and the waveform of the reception signal $S_{RX}$ depend on the frequency characteristics of the transmission path. With the voltage level of the reception signal $S_{RX}$ at the subsequent sampling timing $t_{32}$ as $V_{M2}$, the upper level $V_{TH\_2}$ is defined such that the relation $V_{M2} < V_{TH\_2} < V_H$ holds true.

As can be understood from FIGS. 4A and 4B, the voltage levels $V_{M1}$ and $V_{M2}$ of the reception signal $S_{RX}$ at the respective sampling timings depend on the power loss that occurs in the transmission path. Thus, the multiple levels that can be set for the threshold signal $V_{TH}$ are determined giving consideration to the frequency characteristics of the transmission path.

Figure 5:
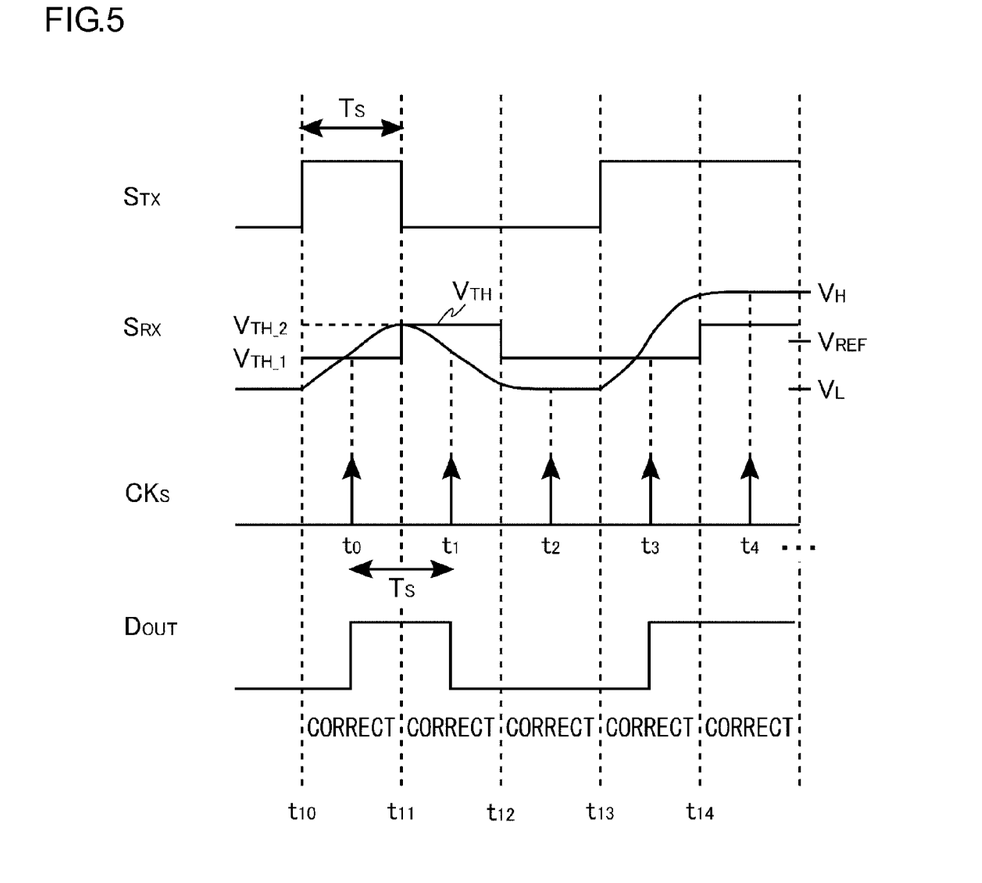
FIG. 5 is an operation waveform diagram showing the operation of the reception circuit.

FIG. 5 is an operation waveform diagram showing the operation of the reception circuit 200. In the initial state, the judgment value $D_{OUT}$ is set to L. In this case, the threshold signal $V_{TH}$ at the sampling timing $t_0$ is set to the lower level $V_{TH\_1}$ because the immediately previous judgment value $D_{OUT}$ is low level. When the transmission signal $S_{TX}$ transits from low level to high level at the time point $t_{10}$, the reception signal $S_{RX}$ gradually rises according to the waveform degraded due to the transmission path. In this case, the reception signal $S_{RX}$ is higher than the threshold signal $V_{TH\_1}$. Thus, the judgment value $D_{OUT}$ is set to high level, which is a correct value.

When the judgment value $D_{OUT}$ is set to high level, the threshold signal $V_{TH}$ at the subsequent sampling timing $t_1$ is set to the upper level $V_{TH\_2}$. When the transmission signal $S_{TX}$ transits from high level to low level at the time point $t_{11}$, the reception signal $S_{RX}$ gradually drops according to the waveform degraded due to the transmission path. In this case, the relation $S_{RX} < V_{TH\_2}$ holds true at the sampling timing $t_1$. Thus, the judgment value $D_{OUT}$ is set to low level, which is a correct value.

When the judgment value $D_{OUT}$ is set to low level, the threshold signal $V_{TH}$ at the subsequent sampling timing $t_2$ is set to the lower level $V_{TH\_1}$. At the time point $t_{12}$, the transmission signal $S_{TX}$ remains at low level, and the reception signal $S_{RX}$ also remains at low voltage level. In this case, the relation $S_{RX} < V_{TH\_1}$ holds true at the sampling timing $t_2$. Thus, the judgment value $D_{OUT}$ is set to low level, which is a correct value.

When the judgment value $D_{OUT}$ is set to low level, the threshold signal $V_{TH}$ at the subsequent sampling timing $t_3$ is set to the lower level $V_{TH\_1}$. At the time point $t_{13}$, the transmission signal $S_{TX}$ transits to high level, and accordingly, the reception signal $S_{RX}$ gradually rises. In this case, the relation $S_{RX} > V_{TH\_1}$ holds true at the sampling timing $t_3$. Thus, the judgment value $D_{OUT}$ is set to high level, which is a correct value.

When the judgment value $D_{OUT}$ is set to high level, the threshold signal $V_{TH}$ at the subsequent sampling timing $t_4$ is set to the upper level $V_{TH\_2}$. At the time point $t_{14}$, the transmission signal $S_{TX}$ remains at high level, and accordingly, the reception signal $S_{RX}$ further rises. In this case, the relation $S_{RX} > V_{TH\_2}$ holds true at the sampling timing $t_4$. Thus, the judgment value $D_{OUT}$ is set to high level, which is a correct value.

The above is the operation of the reception circuit 200.

In summary, in a case in which it can be assumed that the reception signal $S_{RX}$ has been received correctly in the past sampling timings, it can also be assumed that the history of the judgment values $D_{OUT}$ acquired in the past sampling timings represents the waveform of the transmission signal $S_{TX}$. In a case in which the frequency characteristics of the transmission path are known, the waveform of the reception signal $S_{RX}$ can be estimated based on the assumed transmission signal $S_{TX}$. That is to say, the voltage level of the reception signal $S_{RX}$ at the next sampling timing can be predicted. With such an embodiment, by dynamically adjusting the level of the threshold signal $V_{TH}$ according to the reception signal $S_{RX}$ thus predicted, such an arrangement is capable of correctly detecting the transmission signal $S_{TX}$ from the degraded reception signal $S_{RX}$.

Here, the range of variation of the threshold signal $V_{TH}$ is represented by $\Delta V = V_{TH\_2} - V_{TH\_1}$. With such an arrangement, the voltage level of the threshold signal $V_{TH}$ used at a given sampling timing $t_j$ should preferably become stable at least immediately before the sampling timing $t_j$ after the judgment value $D_{OUT}$ has been determined at the previous sampling timing $t_{j-1}$. The generation of such a threshold signal $V_{TH}$ requires a far lower operation speed than that required to provide a pre-emphasis operation.

Furthermore, with an arrangement employing pre-emphasis, the driver provided to the transmission end is required to drive the output voltage with an amplitude that is greater than the voltage difference between the high level voltage $V_H$ and the low level voltage $V_L$. With the present method, such a driver may drive the output between the high level voltage $V_H$ and the low level voltage $V_L$. Thus, such an arrangement allows the transmission-side driver to have a reduced driving capability. Thus, the present method may suitably be applicable to arrangements to which the pre-emphasis method is not applicable.

In addition, with the pre-emphasis method, the cable 4 functions as a load of the transmission-end driver. In contrast, with the present method, the input terminal of the comparator 202 functions as a load of the threshold generation circuit 206. Typically, the comparator 202 has a very high input impedance. Accordingly, the threshold generation circuit 206 may be configured to have a large output impedance (may be configured to have a small load driving capability). Thus, from this viewpoint, the present method is advantageous as compared with the pre-emphasis method.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 6:
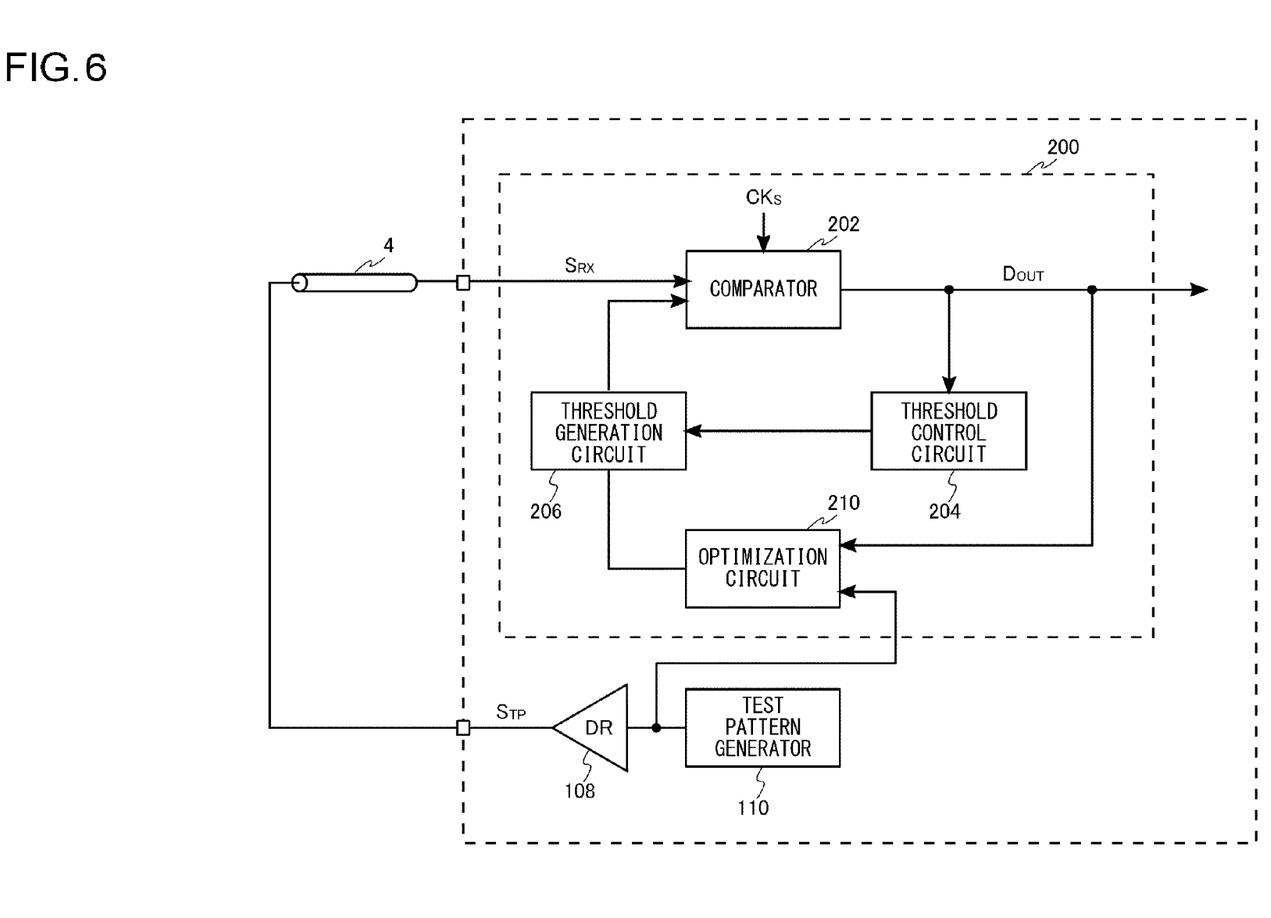
FIG. 6 is a block diagram showing the reception circuit according to a first modification.

FIG. 6 is a block diagram showing a reception circuit 200a according to a first modification. The reception circuit 200a further includes an optimization circuit 210, in addition to the components of the reception circuit 200 shown in FIG. 3. The optimization circuit 210 optimizes the multiple levels that can be set for each threshold signal $V_{TX}$ in a state in which, instead of the transmission signal $S_{TX}$ generated by the DUT 2, a training pattern $S_{TP}$ is supplied to the test apparatus 100 via the cable 4.

For example, one end of the cable 4 is connected to the output of the driver 108 of a given channel. The test pattern generator 110 generates a test pattern $S_{TP}$. The training pattern $S_{TP}$ may be configured as a PRBS (Pseudo-Random Bit Sequence) or a predetermined cyclic pattern. The test pattern generator 110 may be configured as a combination of the pattern generator 102, the timing generator 104, and the format controller 106 shown in FIG. 2. Also, the test pattern generator 110 may be configured as an arbitrary waveform generator, etc., arranged as an external component of the test apparatus 100.

For example, the optimization circuit 210 may optimize the multiple levels that can be set for each threshold signal $V_{TH}$ such that the bit error rate calculated based on the judgment value $D_{OUT}$ and the original training pattern becomes small. Specifically, the reception circuit 200a may measure the bit error rate while sweeping the multiple levels $V_{TH\_1}$ and $V_{TH\_2}$ that can be set for the threshold signal $V_{TH}$, so as to optimize the multiple levels $V_{TH\_1}$ and $V_{TH\_2}$.

Figure 7A:
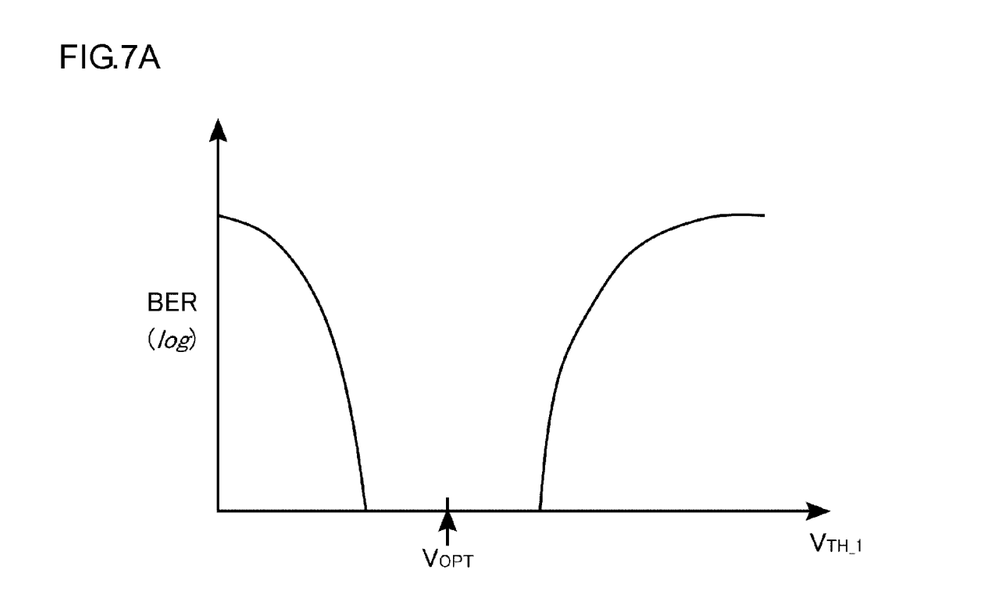
FIGS. 7A and 7B are diagrams each showing optimization of the lower level $V_{TH\_1}$ by means of an optimization circuit.
Figure 7B:
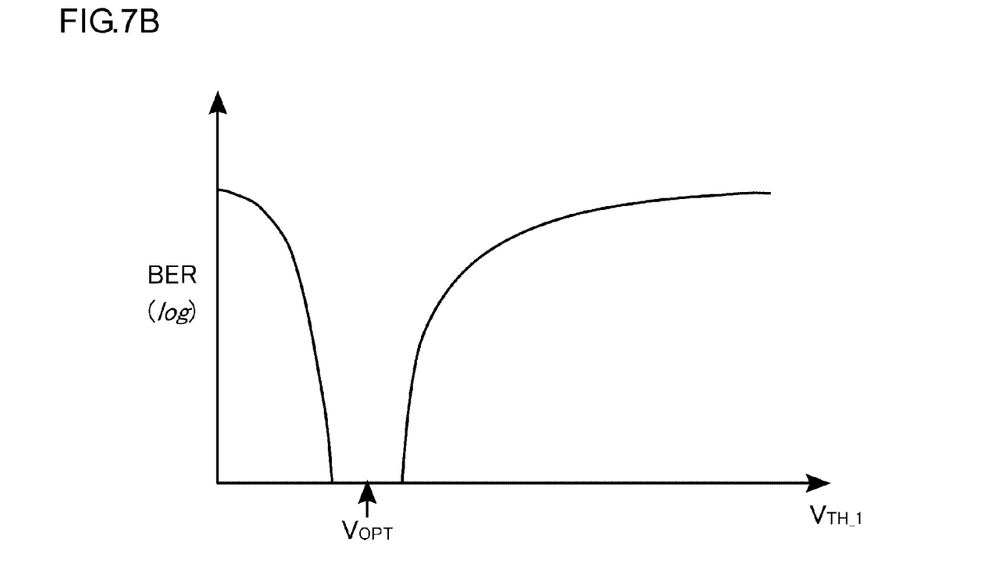

FIGS. 7A and 7B are diagrams for describing the optimization of the lower level $V_{TH\_1}$ provided by the optimization circuit 210. The horizontal axis represents the lower level $V_{TH\_1}$, and the vertical axis represents the bit error rate. FIG. 7A shows the optimization in a case in which the transmission path involves low power loss, which corresponds to a case as shown in FIG. 4A. FIG. 7B shows the optimization in a case in which the transmission path involves large power loss, which corresponds to a case as shown in FIG. 4B. As shown in FIGS. 4A and 4B, the lower level $V_{TH\_1}$ is set in a range represented by $V_L < V_{TH\_1} < V_{M1}$. Thus, the optimization circuit 210 sweeps the lower level $V_{TH\_1}$ in this range, i.e., between $V_L$ and $V_{M1}$, such that the bit error rate becomes sufficiently small, thereby detecting the optimized value $V_{OPT}$.

Examples of such an optimized value $V_{OPT}$ that can be selected include: (i) a point at which the bit error rate becomes its minimum; (ii) a desired point selected from among points at which the bit error rate becomes zero; (iii) a center of a range in which the bit error rate becomes zero; (iv) an average point of a right end point and a left end point that each exhibit a predetermined value X that is a sufficiently small value; and (v) a point at which the bit error rate becomes its minimum value in a calculation based on a function obtained by curve fitting in a case in which the bit error rate can be represented by such a function obtained by curve fitting.

The same can be said of the optimization of the upper level $V_{TH\_2}$. Specifically, the optimization circuit 210 sweeps the upper level $V_{TH\_2}$ in a range between $V_{M2}$ and $V_H$, and detects the optimized value $V_{OPT}$ such that bit error rate becomes sufficiently small.

Alternatively, in a case in which the waveform of the reception signal $S_{RX}$ has symmetry in the vertical direction, one of the lower level $V_{TH\_1}$ or the upper level $V_{TH\_2}$ may be optimized by means of the optimization circuit 210, following which the other level may be optimized by calculation.

Before the bit error rate measurement, the error correction function is preferably disabled. However, the error correction function may be enabled.

[Second Modification]

Description has been made in the embodiment regarding an arrangement in which the threshold signal $V_{TH}$ at a given sampling timing $t_j$ is selected based on a single judgment value $D_{OUT(j-1)}$ acquired at an immediately previous sampling timing. However, the present invention is not restricted to such an arrangement. In a case in which the transmission path involves large power loss, as shown in FIG. 4B, in some cases, the transition time of the reception signal $S_{RX}$ is longer than the sampling interval $T_S$. In this case, the reception signal $S_{RX}$ at a given sampling timing $t_j$ is affected by the transition history of the transmission signal $S_{TX}$ over multiple past periods. Thus, in an embodiment, the level of the threshold signal $V_{TH}$ may be selected based on multiple, i.e., N (N represents an integer of 2 or more) previous judgment values $D_{OUT(j-1)}$, $D_{OUT(j-2)}$ and the like.

In a case in which N=2, four transition patterns are conceivable as follows.
Pattern 1: 0→0→1 or 0.
Pattern 2: 0→1→1 or 0.
Pattern 3: 1→0→1 or 0.
Pattern 4: 1→1→1 or 0.

In this case, the threshold signal $V_{TH}$ may be switchable between four levels $V_{TH\_1}$ through $V_{TH\_4}$, and the level of the threshold signal $V_{TH}$ may be determined based on a transition pattern that represents the previous two transition points.

In a case in which N=3, eight transition patterns are conceivable as follows.
Pattern 1: 0→0→0→1 or 0.
Pattern 2: 0→0→1→1 or 0.
Pattern 3: 0→1→0→1 or 0.
Pattern 4: 0→1→1→1 or 0.
Pattern 5: 1→0→0→1 or 0.
Pattern 6: 1→0→1→1 or 0.
Pattern 7: 1→1→0→1 or 0.
Pattern 8: 1→1→1→1 or 0.

In this case, the threshold signal $V_{TH}$ may be switchable between eight levels $V_{TH\_1}$ through $V_{TH\_8}$, and the level of the threshold signal $V_{TH}$ may be determined based on a transition pattern that represents the previous three transition points.

Figure 8A:
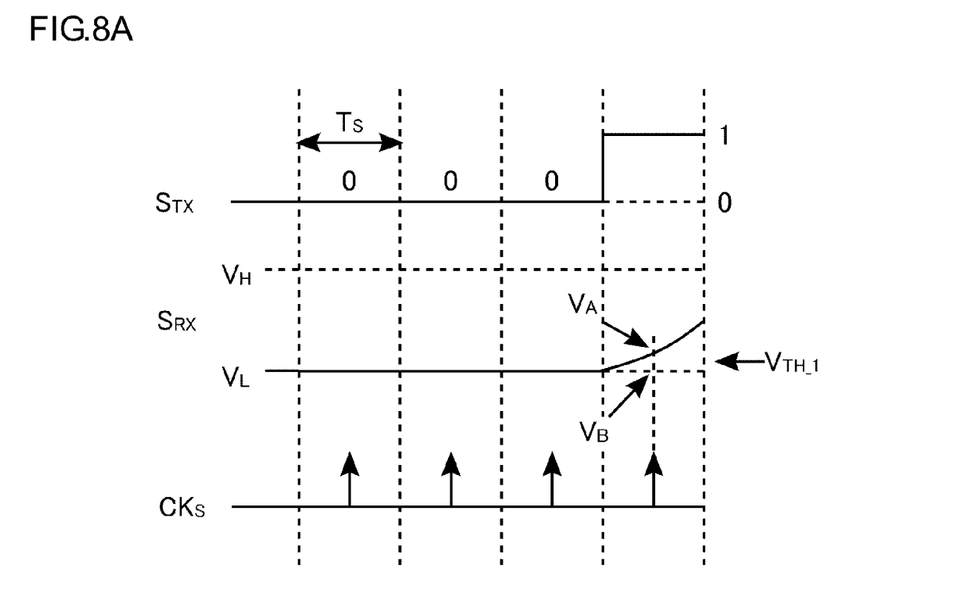
FIGS. 8A and 8B are waveform diagrams showing the waveforms of the reception signal $S_{RX}$ according to two different transition patterns of the transmission signal $S_{TX}$.
Figure 8B:
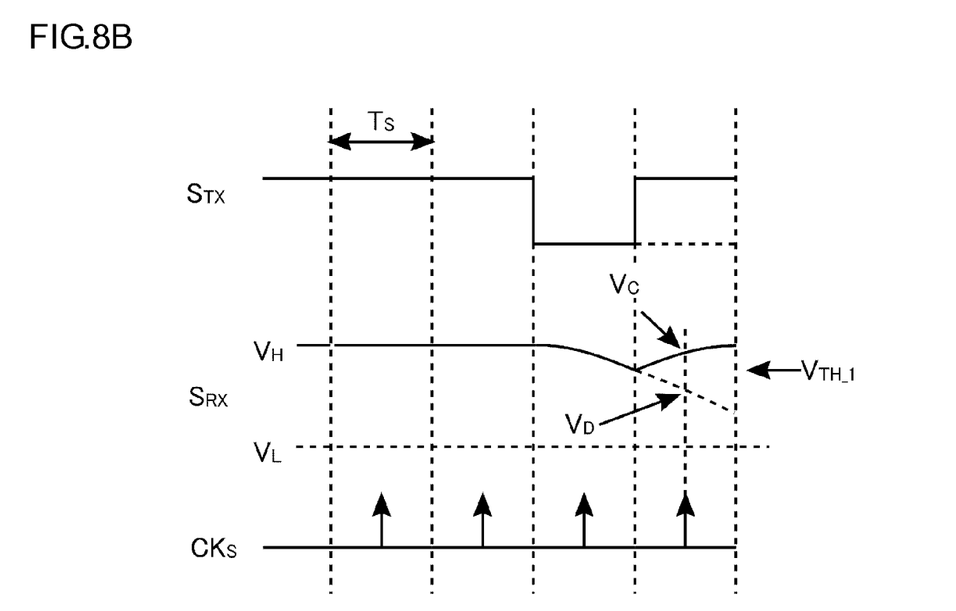

FIGS. 8A and 8B are waveform diagrams each showing a reception signal $S_{RX}$ that corresponds to the transmission signal $S_{TX}$ having a different transition pattern. FIG. 8A shows the waveform of the reception signal $S_{RX}$ in a case in which the transmission signal $S_{TX}$ has a transition pattern of 0→0→0→1 or 0. FIG. 8B shows the waveform of the reception signal $S_{RX}$ in a case in which the transmission signal $S_{TX}$ has a transition pattern of 1→1→0→1 or 0. Referring to FIG. 8A, the first level $V_{TH\_1}$ may preferably be determined as a voltage level between the voltage level $V_A$ of the reception signal $S_{RX}$ which is obtained when the transmission signal $S_{TX}$ transits according to a transition pattern of 0→0→0→1 and the voltage level $V_B$ of the reception signal $S_{RX}$ which is obtained when the transmission signal $S_{TX}$ transits according to a transition pattern of 0→0→0→0. Referring to FIG. 8B, the seventh level $V_{TH\_7}$ may preferably be determined as a voltage level between the voltage level $V_C$ of the reception signal $S_{RX}$ which is obtained when the transmission signal $S_{TX}$ transits according to a transition pattern of 1→1→0→1 and the voltage level $V_D$ of the reception signal $S_{RX}$ which is obtained when the transmission signal $S_{TX}$ transits according to a transition pattern of 1→1→0→0. The other levels may be determined in the same way.

By generalizing such a function, the threshold generation circuit 206 is configured to switch the threshold signal $V_{TH}$ between multiple, i.e., $2^N$ levels. The threshold control circuit 204 sets the threshold signal $V_{TH}$ to a single level according to a combination of the immediately previous N (which represents an integer) judgment values $D_{OUT}$. It should be noted that, in a case in which N is 2 or more, and in a case in which several of the multiple levels that can be set for the threshold signal $V_{TH}$ are close to each other, such close levels may be replaced by a single level.

[Third Modification]

The transmission signal $S_{TX}$ may be configured as a digital signal that is switchable between three or more levels including at least one intermediate level in addition to the low level and the high level. For example, with the reception circuit 200 that receives an M-level digital signal, such an arrangement requires (M−1) threshold signals $V_{TH}$. The threshold generation circuit 206 may be configured to generate (M−1) threshold signals $V_{TH}$, and to adjust the level of each threshold signal $V_{TH}$ according to the control operation of the threshold control circuit 204.

[Fourth Modification]

The transition timings of the threshold signal $V_{TH}$ are not restricted to the time points $t_{10}$, $t_{11}$, $t_{12}$, and so forth, as shown in FIG. 5. Settling of the threshold signal $V_{TH}$ is required at least before each sampling timing $t_0$, $t_1$, $t_2$, or the like. Thus, the transition timing of the threshold signal $V_{TH}$ may be a time point immediately after the previous judgment value $D_{OUT}$ has been determined. Also, the transition timing of the threshold signal $V_{TH}$ may be a time point immediately before each sampling timing $t_0$, $t_1$, $t_2$, or the like.

[Fifth Modification]

The usage of the reception circuit 200 is not restricted to such a test apparatus 100. Rather, the present invention is applicable to various kinds of transmission systems.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

DESCRIPTION OF THE REFERENCE NUMERALS

1 test system, 2 DUT, 4, 5 cable, 100 test apparatus, 102 pattern generator, 104 timing generator, 106 format controller, 108 driver, 110 test pattern generator, 200 reception circuit, 202 comparator, 204 threshold control circuit, 206 threshold generation circuit, 210 optimization circuit.

What is claimed is:

1. A test apparatus that receives, via a transmission path, a transmission signal generated by a device under test, wherein the transmission signal is a binary digital signal that varies between high level and low level, the test apparatus comprising:
- a comparator circuit structured to compare a reception signal after signal transmission with a single threshold signal, and generates a judgment value which takes a first level when the reception signal is lower than the single threshold signal and takes a second level when the reception signal is higher than the single threshold signal, wherein the level of the judgement value indicates whether the transmission signal is high level or low level for every sampling timing;
- a threshold generation circuit structured to generate the single threshold signal, the single threshold signal is switchable in multiple levels; and
- a threshold control circuit structured to receive the judgment value and to determine a level of the single threshold signal from among the multiple levels at each sampling timing based on a history of the judgment value obtained at a past sampling timing.

2. The test apparatus according to claim 1, wherein the threshold generation circuit is structured to switch the single threshold signal between a lower level and an upper level that is higher than the lower level according to a control operation by the threshold control circuit,
   wherein, when the judgment value obtained at an immediately previous sampling timing represents a low level, the threshold control circuit sets the threshold signal to the lower level,
   and wherein, when the judgment value obtained at an immediately previous sampling timing represents a high level, the threshold control circuit sets the threshold signal to the upper level.

3. The test apparatus according to claim 1, wherein the threshold generation circuit is structured to switch the single threshold signal between a plurality of levels according to a control operation by the threshold control circuit,
   and wherein the threshold control circuit sets the threshold signal to one among the plurality of levels according to a combination of the judgment values acquired at N (N represents a natural number) immediately previous timings.

4. The test apparatus according to claim 3, wherein the threshold generation circuit is structured to switch the single threshold signal between $2^N$ levels.

5. The test apparatus according to claim 1, further comprising an optimization circuit that optimizes a plurality of levels that can be set for each of the at least one threshold signal in a state in which a training pattern is supplied to the test apparatus via the transmission path instead of the transmission signal generated by the device under test.

6. The test apparatus according to claim 5, wherein the optimization circuit optimizes the plurality of levels that can be set for each of the at least one threshold signal such that a bit error rate becomes small.

7. A test apparatus that receives, via a transmission path, a transmission signal generated by a device under test, wherein the transmission signal is a binary digital signal that varies between high level and low level, the test apparatus comprising:
- a comparator circuit structured to compare a reception signal after signal transmission with a single threshold signal, and that generates a judgment value which takes a first level when the reception signal is lower than the single threshold signal and takes a second level when the reception signal is higher than the single threshold signal, wherein the level of the judgement value indicates whether the transmission signal is high level or low level for every sampling timing;
- a threshold generation circuit structured to generate the single threshold signal, the single threshold signal is switchable in multiple levels;
- a threshold control circuit structured to receive the judgment value and to determine a level of the single threshold signal from among the multiple levels at each sampling timing based on a history of the judgment value obtained at a past sampling timing; and
- an optimization circuit structured to optimize a level of the at least one threshold signal in a state in which a training pattern is supplied to the test apparatus via the transmission path instead of the transmission signal generated by the device under test.

* * * * *